(12) United States Patent
Wei et al.

(10) Patent No.: US 12,745,344 B2
(45) Date of Patent: Sep. 22, 2026

(54) PCB, PCB MOUNTING BOX, CASE ASSEMBLY, AND CASE

(71) Applicant: ZTE CORPORATION, Shenzhen (CN)

(72) Inventors: Shoulong Wei, Shenzhen (CN); Chaoxing Xu, Shenzhen (CN); Lixia Wu, Shenzhen (CN); Guiming Lu, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 39 days.

(21) Appl. No.: 18/690,310

(22) PCT Filed: Apr. 7, 2022

(86) PCT No.: PCT/CN2022/085443

§ 371 (c)(1),
(2) Date: Mar. 8, 2024

(87) PCT Pub. No.: WO2023/035603

PCT Pub. Date: Mar. 16, 2023

(65) Prior Publication Data

US 2024/0407078 A1 Dec. 5, 2024

(30) Foreign Application Priority Data

Sep. 8, 2021 (CN) ......................... 202111049858.3

(51) Int. Cl.
*H05K 5/02* (2006.01)
*H05K 1/02* (2006.01)
(Continued)

(52) U.S. Cl.
CPC ......... *H05K 1/0215* (2013.01); *H05K 5/0247* (2013.01); *H05K 5/13* (2025.01);
(Continued)

(58) Field of Classification Search
USPC .......................................................... 361/753
See application file for complete search history.

(56) References Cited

U.S. PATENT DOCUMENTS 5,333,100 A * 7/1994 Anhalt ................. G06K 19/077
361/752
5,708,552 A * 1/1998 Han ..................... H05K 9/0016
361/741
(Continued)

FOREIGN PATENT DOCUMENTS

CN 203233592 U 10/2013
CN 203708722 U 7/2014
(Continued)

OTHER PUBLICATIONS

WIPO, International Search Report issued on May 20, 2022.
(Continued)

*Primary Examiner* — Hung S. Bui
(74) *Attorney, Agent, or Firm* — Li & Cai Intellectual Property (USA) Office

(57) ABSTRACT

Disclosed are a PCB, a PCB mounting box, a case assembly, and a case. The PCB includes: a PCB body and a grounding region on a side surface of the PCB body. The grounding region is connected to a GND network in the PCB body. By providing an additional grounding region connected to the GND network of the PCB body on the side surface of the PCB body, the PCB can be grounded by means of the grounding region on the side surface instead of a grounding hole running through the PCB. In this way, the PCB is allowed to be grounded by means of the grounding region on the side surface in a pluggable mounting mode, so that the mounting mode of the PCB becomes more flexible, and the grounding of the PCB becomes more convenient.

11 Claims, 3 Drawing Sheets

(51) Int. Cl.

| | |
|---|---|
| ***H05K 5/13*** | (2025.01) |
| ***H05K 7/14*** | (2006.01) |
| ***H05K 9/00*** | (2006.01) |

(52) U.S. Cl.
CPC ......... *H05K 7/1418* (2013.01); *H05K 7/1427* (2013.01); *H05K 9/0039* (2013.01); *H05K 2201/09354* (2013.01)

(56) References Cited

U.S. PATENT DOCUMENTS

| | | | | |
|---|---|---|---|---|
| 6,233,158 | B1 | 5/2001 | Leman | |
| 7,042,737 | B1 * | 5/2006 | Woolsey | H05K 9/0062 361/753 |
| 2010/0315792 | A1 * | 12/2010 | Jones | H05K 9/0047 361/753 |
| 2012/0008285 | A1 * | 1/2012 | Renkel, Jr. | H05K 7/1491 361/724 |
| 2019/0044452 | A1 | 2/2019 | Arita | |
| 2019/0191573 | A1 * | 6/2019 | Araki | H05K 7/14 |

FOREIGN PATENT DOCUMENTS

| | | | | | |
|---|---|---|---|---|---|
| CN | 205266006 | U | | 5/2016 | |
| CN | 105636336 | A | | 6/2016 | |
| CN | 107801296 | A | | 3/2018 | |
| CN | 109392266 | A | | 2/2019 | |
| CN | 209420043 | U | | 9/2019 | |
| CN | 212005982 | U | | 11/2020 | |
| JP | 2002042913 | A | * | 2/2002 | H01R 4/64 |
| JP | 2003046247 | A | * | 2/2003 | H05K 3/46 |
| JP | 2006024618 | A | * | 1/2006 | H05K 1/02 |
| WO | WO-2014002238 | A1 | * | 1/2014 | H05K 1/141 |
| WO | WO-2017146394 | A1 | * | 8/2017 | H05K 1/0221 |

OTHER PUBLICATIONS

European Patent Office, the Extended European Search Report dated Jul. 30, 2025, for corresponding EP application No. 22866081.7.

China Patent Office, First Office Action dated Jul. 23, 2026, for corresponding CN application No. 202111049858.3.

* cited by examiner

PCB, PCB MOUNTING BOX, CASE ASSEMBLY, AND CASE

CROSS-REFERENCE TO RELATED APPLICATIONS

The present disclosure claims the priority of Chinese patent application No. 202111049858.3 titled "PCB, PCB MOUNTING BOX, CASE ASSEMBLY, and CASE" filed with the CNIPA on Sep. 8, 2021, the entire contents of which are incorporated herein by reference.

TECHNICAL FIELD

Embodiments of the present disclosure of relate to, but are not limited to, the technical field of electrical devices, and in particular, to a PCB, a PCB mounting box, a case assembly, and a case.

BACKGROUND

In a conventional electrical device case, the PCB is typically mounted inside the case. FIG. 1 shows a PCB 1, a screw 2, and a side plate 3 of a case. A GND lead is generally provided in a BOTTOM layer or TOP layer of the PCB. The GND lead is lapped with the case through a screw or other structural lapping mode. In this conventional method, it is very troublesome to implement grounding of the PCB for some PCBs mounted at particular positions. For example, when the PCB is placed at a position close to a center of the case, a relatively long screw is needed to connect the PCB to the case. On one hand, the long screw tends to occupy more inner space of the case, and reduces the space utilization rate of the case. On the other hand, for lightweight and cost saving purposes, a case surface parallel to the PCB is selected to be partially made of plastic. The use of plastic may result in direct failure of the current screw grounding method. The PCB, the PCB mounting box, the case assembly, and the case provided in the present disclosure aim to solving the problem of inconvenient grounding for current PCBs mounted in a pluggable mode.

SUMMARY

The technical problem to be solved by the present disclosure is that the current circuit structure of the PCB is inconvenient for grounding in a pluggable mounting mode.

To solve the above technical problem, an embodiment of the present disclosure provides a PCB, including: a PCB body and a grounding region on a side surface of the PCB body, wherein the grounding region is connected to a GND network in the PCB body.

Further, an embodiment of the present disclosure further provides a PCB mounting box, including: a cuboid mounting box body having an opening on one side, and a grounding plate placed over the opening of the mounting box body; wherein a mounting screw is disposed around the opening of the mounting box body, through which the mounting box body is fixed to the grounding plate; a guide groove for fixing the PCB is further provided on an inner wall of the mounting box body in a direction perpendicular to the opening; and a conductive component in contact with the grounding region of the PCB is provided inside the grounding plate.

Further, an embodiment of the present disclosure further provides a case assembly, including: a PCB as described above, and a mounting box as described above; wherein the PCB is mounted into a guide groove in the mounting box; and a grounding region of the PCB is in contact with a conductive component inside the grounding plate.

Further, an embodiment of the present disclosure further provides a case, including: a case housing, and a case assembly as described above; wherein the case housing is grounded; and a grounding plate of the case assembly is fixedly connected to the case housing.

Advantageous Effects

Embodiments of the present disclosure provide a PCB, a PCB mounting box, a case assembly, and a case. The PCB includes: a PCB body and a grounding region on a side surface of the PCB body. The grounding region is connected to a GND network in the PCB body. By providing an additional grounding region connected to the GND network of the PCB body on the side surface of the PCB body, the PCB can be grounded by means of the grounding region on the side surface instead of a grounding hole running through the PCB. In this way, the PCB is allowed to be grounded by means of the grounding region on the side surface in a pluggable mounting mode, so that the mounting mode of the PCB becomes more flexible, and the grounding of the PCB becomes more convenient.

BRIEF DESCRIPTION OF DRAWINGS

The present disclosure will now be further described below in conjunction with the drawings and embodiments, in which.

DETAIL DESCRIPTION OF EMBODIMENTS

For clarity and better understanding of objects, technical solutions and advantages of the present disclosure, embodiments of the present disclosure will be described in detail below with reference to specific implementations and accompanying drawings. It will be understood that the specific embodiments described herein are merely for illustration of the present disclosure and are not intended to limit the present disclosure.

It will be understood that the specific embodiments described herein are merely for illustration of the present disclosure and are not intended to limit the present disclosure.

In the description below, suffixes representing elements, such as "module", "component" or "unit", are used only for the convenience of explanation of the present disclosure, and have no specific meaning by themselves. Therefore, "module", "component" or "unit" may be used interchangeably.

First Embodiment

Figure 1:
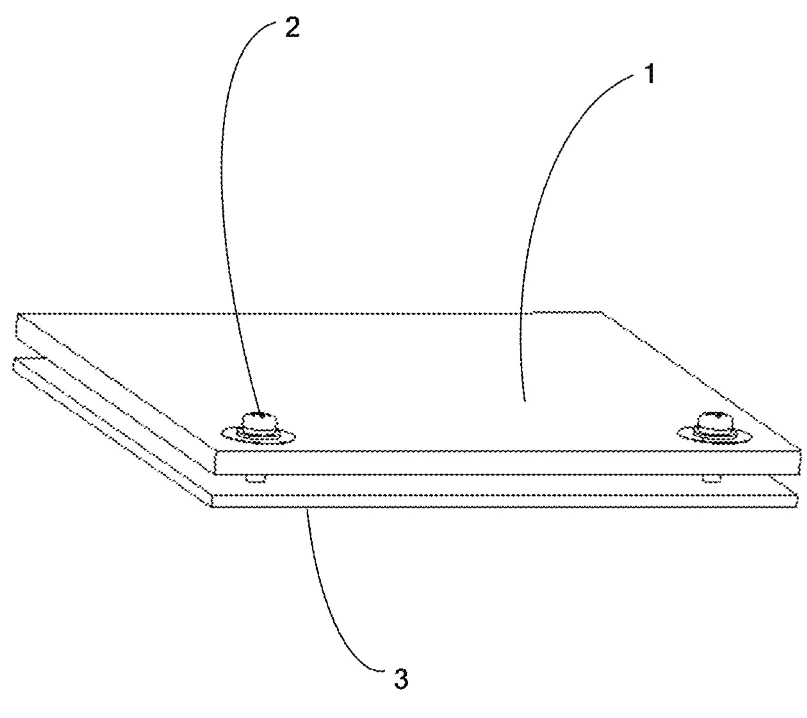
FIG. 1 is a schematic diagram of grounding a conventional PCB.
Figure 2:
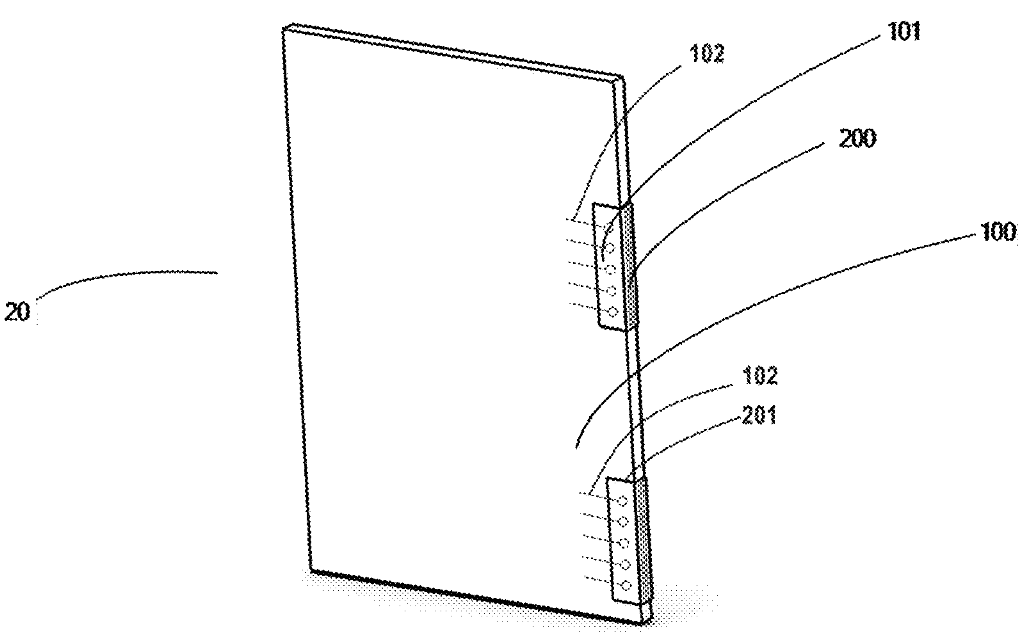
FIG. 2 is a schematic diagram of a PCB according to a first embodiment of the present disclosure.

FIG. 2 is a schematic diagram of a PCB according to this embodiment. The PCB 20 includes: a PCB body 100 and a grounding region 200 on a side surface of the PCB body 100. The grounding region 200 is connected to a GND network 101 in the PCB body 100.

The GND network 101 in the PCB body 100 refers to wirings 102 designed for grounding in each wiring layer of the PCB. It will be understood that when the PCB has a plurality of wiring layers, the connection between the GND network 101 and the grounding region 200 includes, but is not limited to, connection between the grounding region and a GND network in any one of the layers, or connection between the grounding region and the GND networks in multiple layers.

In another embodiment, the grounding region 200 is a metal plate 201 formed by the GND network 101 in the PCB body 100 extending to the side surface of the PCB body 100.

Typically, each wiring layer of the PCB is a copper plate. Therefore, the grounding region on the side surface of the PCB body may lead the copper plate out of the grounding network by the same copper cladding process to extend to cover the side surface of the PCB body. For example, the copper plate is led out from the GND region of the BOTTOM layer and/or TOP layer of the PCB by copper plating, and the extended copper plate covers the side surface of the PCB body.

In another embodiment, at least one grounding region is provided on the side surface of the PCB body.

Referring to FIG. 2, grounding regions 200 in FIG. 2 are disposed in two regions on the side surface of the PCB body 100, respectively, and the provision of a plurality of grounding regions can improve the reliability of grounding.

This embodiment provides a PCB, including: a PCB body and a grounding region on a side surface of the PCB body. The grounding region is connected to a GND network in the PCB body. By providing an additional grounding region connected to the GND network of the PCB body on the side surface of the PCB body, the PCB can be grounded by means of the grounding region on the side surface, and a grounding hole running through the PCB is omitted. In this way, the PCB is allowed to be grounded conveniently even in a pluggable mounting mode, so that the mounting mode of the PCB becomes more flexible, and the grounding of the PCB becomes more convenient.

Second Embodiment

Figure 3:
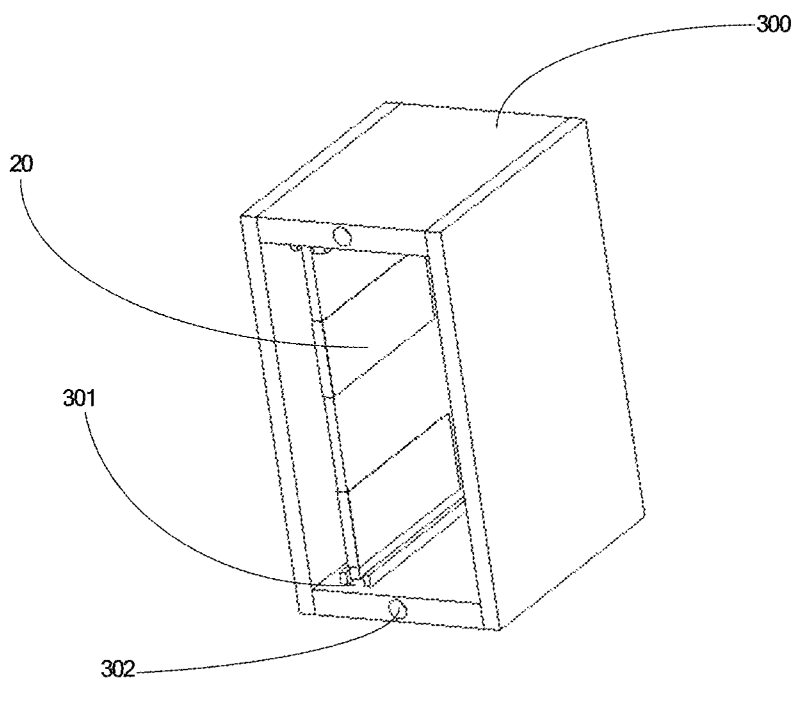
FIG. 3 is a schematic diagram showing a mounting box body of a mounting box according to a second embodiment and a third embodiment of the present disclosure.
Figure 4:
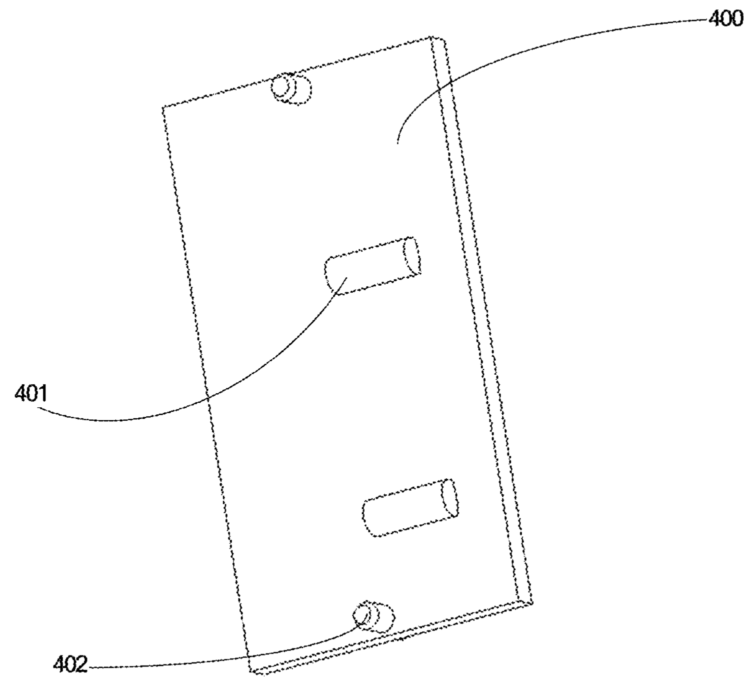
FIG. 4 is a schematic diagram showing a grounding plate of a mounting box according to the second embodiment and the third embodiment of the present disclosure.
Figure 5:
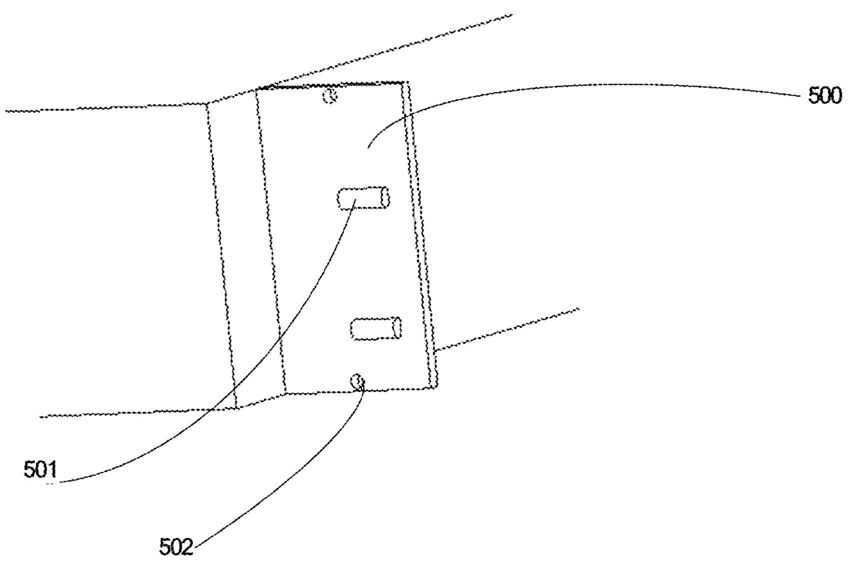
FIG. 5 is a schematic diagram showing another grounding plate of a mounting box according to the second embodiment and the third embodiment of the present disclosure.

Referring to FIGS. 3 to 5, FIG. 3 is a schematic diagram showing a mounting box body of a PCB mounting box according to this embodiment, FIG. 4 is a schematic diagram of a grounding plate in a PCB according to this embodiment, and FIG. 5 is a schematic diagram of another grounding plate in a PCB according to this embodiment. The difference between FIG. 4 and FIG. 5 resides in that the grounding plate of FIG. 4 is a separate single board, while the grounding plate of FIG. 5 is a grounding plate directly extended from a side surface of a case. As shown in FIGS. 3 to 5, the mounting box includes: a cuboid mounting box body 300 having an opening on one side, and a grounding plate 400/500 placed over the opening of the mounting box body 300. A fixing assembly is disposed around the opening of the mounting box body 300, through which the grounding plate 400/500 is fixed to the mounting box body 300. A guide groove 301 for fixing the PCB 20 is further provided on an inner wall of the mounting box body 300 in a direction perpendicular to the opening; and a conductive component 401/501 in direct contact with the grounding region of the PCB 20 is provided inside the grounding plate 400/500. It will be understood that the grounding plate 400/500 is placed over the opening of the mounting box body 300 when assembled, where the conductive component 401/501 inside the grounding plate 400/500 is in contact with the grounding plate on the side surface of the PCB 20, the grounding plate is electrically connected to the grounding region of the PCB fully and stably through the conductive component, and the grounding region of the PCB is connected to a case housing through the conductive component and the grounding plate to realize grounding.

In another embodiment, the conductive component is any one of a conductive fabric or a metal tab.

In another embodiment, the number of conductive components is the same as the number of grounding regions on the PCB.

In another embodiment, the mounting box body is a plastic box. It will be understood that the plastic case is used for purposes of reducing the manufacturing cost, and that in practical applications, the mounting body is made of a material including, but not limited to, plastic.

In another embodiment, the fixing assembly includes a screw and a screw hole; when the screw is fixed to the mounting box body, the screw hole is provided in the grounding plate at a position corresponding to the screw, so that the screw passes through the screw hole to fix the grounding plate to the mounting box body through a bolt; and when the screw is detachably connected to the grounding plate, the screw hole is provided in the mounting box body at a corresponding position, so that the screw is screwed into the screw hole by rotation to fix the grounding plate and the mounting box body.

Referring to FIGS. 4 and 5, a screw 402/502 is detachably connected to the grounding plate 400/500, a screw hole 302 is provided in the mounting box body 300 at a corresponding position, so that the screw 401/501 is rotatably screwed into the screw hole 302 to fix the grounding plate 400/500 and the mounting box body 300. It will be understood that although the fixing manner of screw and screw hole is selected here, in practical applications, the fixing manner may further include, but is not limited to, screws, snap-fit fasteners, glue, or the like.

This embodiment provides a PCB mounting box, including: a cuboid mounting box body having an opening on one side, and a grounding plate placed over the opening of the mounting box body. A fixing assembly is disposed around the opening of the mounting box body, through which the mounting box body is fixed to the grounding plate. A guide groove for fixing the PCB is further provided on an inner wall of the mounting box body in a direction perpendicular to the opening. A conductive component in contact with the grounding region of the PCB is provided inside the grounding plate. By means of the conductive component inside the grounding plate in contact with the grounding region on the side surface of the PCB plate, the grounding plate is connected to the case to realize grounding.

Third Embodiment

Referring to FIGS. 3 to 5, The case assembly includes: a PCB 20, and a mounting box. The PCB 20 is mounted into a guide groove 301 in the mounting box. A grounding region 200 of the PCB 20 is in contact with a conductive component 401 inside the grounding plate 20.

The case assembly provided in this embodiment includes: a PCB, and a mounting box. The PCB is mounted into a guide groove in the mounting box. A grounding plate of the PCB is in contact with a conductive component inside the grounding plate. By means of the conductive component inside the grounding plate in contact with the grounding plate on the side surface of the PCB plate, the grounding plate is fixedly connected to the case body of the case to realize grounding.

Fourth Embodiment

This embodiment provides a case, including: a case housing, and a case assembly as described above. The case housing is grounded. A grounding plate of the case assembly is fixedly connected to the case housing.

Figure 6:
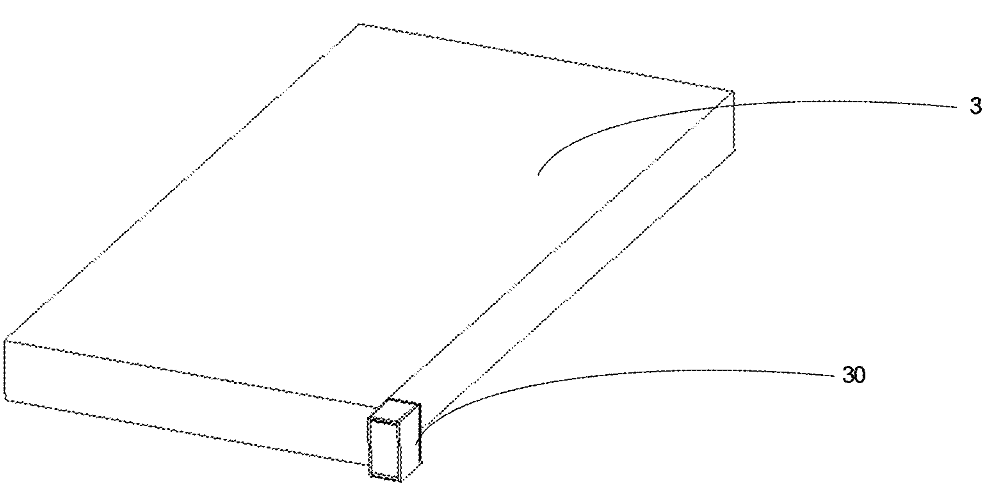
FIG. 6 is a schematic diagram of a case according to a fourth embodiment of the present disclosure.

FIG. 6 is a schematic diagram of a case according to this embodiment. As shown in FIG. 6, the case includes: a case housing 3 and a case assembly 30. The case housing 3 is grounded. A grounding plate of the case assembly 30 is fixedly connected to the case housing 3. The PCB mounted in the case assembly is grounded by electrically connecting the grounding region on the side surface of the PCB to the conductive component on the grounding plate, and then to the case housing through the grounding plate, thereby implementing grounding of the PCB mounted in the case assembly.

It should be noted that, as used herein, the term "comprise" "include" or any variant thereof means to be non-exclusive so that a process, method, item or device including a series of elements includes not only said elements, but also other elements not explicitly listed, or inherent elements of such processes, methods, items or devices. It should be understood that the above embodiments of the present disclosure are merely examples for clearly illustrating the present disclosure and are not intended to limit the implementations of the present disclosure.

The above serial numbers in the embodiments of the present disclosure are merely for description, and do not represent superior or inferior of the embodiments.

Although the embodiments of the present disclosure have been described in connection with the appended drawings, the present disclosure is not limited to the specific implementations described above, which are intended to be illustrative rather than restrictive, and many modifications may be made by those of ordinary skill in the art without departing from the scope of the appended claims, which all fall into the scope of the present disclosure.

What is claimed is:

1. A PCB mounting box, comprising: a cuboid mounting box body having an opening on one side, and a grounding plate placed over the opening of the mounting box body, wherein a fixing assembly is disposed around the opening of the mounting box body, through which the mounting box body is fixed to the grounding plate;

a guide groove for fixing a PCB is further provided on an inner wall of the mounting box body in a direction perpendicular to the opening; and a conductive component in contact with a grounding region of the PCB is provided inside the grounding plate.

2. The mounting box according to claim 1, wherein the conductive component is any one of a conductive fabric or a metal tab.

3. The mounting box according to claim 1, wherein the number of conductive components is the same as the number of grounding regions on the PCB.

4. The mounting box according to claim 1, wherein the mounting box body is a plastic box.

5. The mounting box according to claim 1, wherein the fixing assembly comprises a screw and a screw hole;

the screw is fixed to the mounting box body, the screw hole is provided in the grounding plate at a position corresponding to the screw, so that the screw passes through the screw hole to fix the grounding plate to the mounting box body.

6. The mounting box according to claim 1, wherein the fixing assembly comprises a screw and a screw hole;

the screw is detachably connected to the grounding plate, the screw hole is provided in the mounting box body at a corresponding position, so that the screw is screwed into the screw hole by rotation to fix the grounding plate and the mounting box body.

7. A case assembly, comprising: a PCB and a mounting box, wherein the PCB includes a PCB body and a grounding region on a side surface of the PCB body, the grounding region being connected to a GND network in the PCB body, wherein the grounding region is connected to a GND network in the PCB body, the GND network in the PCB body is wirings for grounding in a wiring layer of the PCB, and the grounding region is a metal plate formed by the GND network in the PCB body extending to the side surface of the PCB body;

wherein the PCB mounting box includes a cuboid mounting box body having an opening on one side, and a grounding plate placed over the opening of the mounting box body, a fixing assembly being disposed around the opening of the mounting box body, through which the mounting box body is fixed to the grounding plate, a guide groove for fixing the PCB being further provided on an inner wall of the mounting box body in a direction perpendicular to the opening, and a conductive component in contact with the grounding region of the PCB being provided inside the grounding plate; and wherein the PCB is mounted into a guide groove in the mounting box; and the grounding region of the PCB is in contact with the conductive component inside the grounding plate.

8. A case, comprising: a case housing, and a case assembly according to claim 7; wherein the case housing is grounded; and a grounding plate of the case assembly is fixedly connected to the case housing.

9. The case assembly according to claim 7, wherein at least one grounding region is provided on the side surface of the PCB body.

10. The case assembly according to claim 7, wherein the conductive component is any one of a conductive fabric or a metal tab.

11. The case assembly according to claim 7, wherein the number of conductive components is the same as the number of grounding regions on the PCB.

* * * * *